United States Patent
Terui

(10) Patent No.: US 11,603,485 B2
(45) Date of Patent: Mar. 14, 2023

(54) SURFACE TREATMENT METHOD OF WAFER AND COMPOSITION USED FOR SAID METHOD

(71) Applicant: CENTRAL GLASS COMPANY, LIMITED, Ube (JP)

(72) Inventor: Yoshiharu Terui, Ube (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 211 days.

(21) Appl. No.: 17/040,902

(22) PCT Filed: Mar. 19, 2019

(86) PCT No.: PCT/JP2019/011387
§ 371 (c)(1),
(2) Date: Sep. 23, 2020

(87) PCT Pub. No.: WO2019/193967
PCT Pub. Date: Oct. 10, 2019

(65) Prior Publication Data
US 2021/0009882 A1  Jan. 14, 2021

(30) Foreign Application Priority Data
Apr. 5, 2018  (JP) .............................. JP2018-072809

(51) Int. Cl.
*C09K 3/18* (2006.01)
*B08B 7/00* (2006.01)
*H01L 21/02* (2006.01)

(52) U.S. Cl.
CPC .............. *C09K 3/18* (2013.01); *B08B 7/0014* (2013.01); *H01L 21/02057* (2013.01)

(58) Field of Classification Search
None
See application file for complete search history.

(56) References Cited

U.S. PATENT DOCUMENTS

2011/0195190 A1  8/2011  Koshiyama et al.
2012/0211025 A1  8/2012  Kumon et al.
(Continued)

FOREIGN PATENT DOCUMENTS

JP   S63-132862   6/1988
JP   2010-103136   5/2010
(Continued)

OTHER PUBLICATIONS

Clements, J. H., "Reviews, Reactive Applications of Cyclic Alkylene Carbonates", Industrial & Engineering Chemistry Research (U.S.), American Chemical Society, 2003, vol. 42, No. 4, p. 663-674.
(Continued)

*Primary Examiner* — Eric W Golightly
*Assistant Examiner* — Arlyn I Rivera-Cordero
(74) *Attorney, Agent, or Firm* — Hamre, Schumann, Mueller & Larson, P.C.

(57) ABSTRACT

A surface treatment method of a Si element-containing wafer including, during a cleaning process of the wafer, forming a water-repellent protective film on at least the recess portion of the uneven pattern by supplying a vapor of a composition containing a water-repellent protective film-forming component and a solvent in a state that a liquid is retained in at least the recess portion of the uneven pattern, changing the vapor of the composition into a liquid and replacing the liquid retained in the recess portion with the liquid of the composition. The water-repellent protective film-forming component consists of a compound of formula [1], and the solvent contains at least an acyclic carbonate.

$$R^1_x(CH_3)_{3-x}SiN(R^2)_2 \qquad [1]$$

$R^1$ is selected from the group consisting of a H and a $C_1$-$C_{10}$ hydrocarbon group; x is an integer of 1 to 3; and $R^2$ is each independently a group selected from the group consisting of methyl, ethyl and acetyl.

16 Claims, 2 Drawing Sheets

(56) References Cited

U.S. PATENT DOCUMENTS

| | | | |
|---|---|---|---|
| 2012/0244720 A1 | 9/2012 | Shimizu et al. | |
| 2016/0293400 A1* | 10/2016 | Kimura | H01L 21/30604 |
| 2017/0043379 A1 | 2/2017 | Sasaki et al. | |
| 2018/0277357 A1 | 9/2018 | Wojtezak et al. | |

FOREIGN PATENT DOCUMENTS

| | | |
|---|---|---|
| JP | 2012-204669 | 10/2012 |
| JP | 2013-118347 | 6/2013 |
| JP | 2013-168583 | 8/2013 |
| JP | 5648053 | 1/2015 |
| JP | 2017-038029 | 2/2017 |

OTHER PUBLICATIONS

International Search Report of PCT/JP2019/011387, dated May 28, 2019, 5 pages including English translation.

* cited by examiner

SURFACE TREATMENT METHOD OF WAFER AND COMPOSITION USED FOR SAID METHOD

CROSS REFERENCE

This application is the national stage filing of international application PCT/JP2019/011387, filed Mar. 19, 2019, which claims the benefit of Japanese application JP 2018-072809, filed Apr. 5, 2018, which are incorporated herein by reference.

FIELD OF THE INVENTION

The present invention relates to a wafer surface treatment method in which a water-repellent protective film is formed using a vapor of a predetermined composition during a cleaning process of a Si element-containing wafer and to such a composition.

BACKGROUND ART

It is required that semiconductor devices for network applications and digital home appliances have higher performance, higher functionality and lower power consumption. Accordingly, the fine processing of circuit patterns has been pursued. With the fine processing of circuit patterns, however, the occurrence of pattern collapses in the circuit patterns is becoming a problem. The manufacturing of the semiconductor device makes great use of a cleaning process for removal of particles and metal impurities. Eventually, the cleaning process occupies 30 to 40% of the entire semiconductor device manufacturing process. The pattern collapse is a phenomenon in which the pattern collapses due to the passage of a gas-liquid interface through the pattern after cleaning or rinsing in the cleaning process when the aspect ratio of the pattern becomes high with the fine patterning of the semiconductor device. The designs of the patterns have to be changed in order to prevent the occurrence of pattern collapses. Further, the occurrence of pattern collapses leads to a deterioration in manufacturing yield. It is thus demanded to develop a technique for preventing a pattern collapse during the cleaning process.

The formation of a water-repellent protective film on a surface of the pattern is known as an effective technique for preventing a pattern collapse. It is necessary to perform such water repellent treatment without drying the surface of the pattern. The water-repellent protective film is hence formed by supplying a water-repellent protective film-forming liquid chemical to the surface of the pattern on which a cleaning liquid etc. is retained and then replacing the cleaning liquid etc. with the liquid chemical.

Patent Document 1 discloses a liquid chemical for, during a cleaning process of a wafer having a fine uneven pattern on a surface thereof, forming a water-repellent protective film on the uneven pattern by supplying a vapor of the liquid chemical to a surface of the uneven pattern after introducing a OH group to the surface of the uneven pattern, characterized in that the liquid chemical contains: 93.5 to 97.499 mass % of at least one kind of fluorine-containing solvent selected from the group consisting of hydrofluoroethers and hydrochlorofluorocarbons; 2 to 5 mass % of propylene glycol monomethyl ether acetate; 0.5 to 5 mass % of at least one kind of silazane compound selected from the group consisting of hexamethyldisilazane and tetramethyldisilazane; and 0.001 to 0.25 mass % of at least one kind of acid selected from the group consisting of trifluoroacetic acid, trifluoroacetic anhydride and trimethylsilyltrifluoroacetate, and a wafer treatment method using such a liquid chemical.

Patent Document 2 discloses a method for effective hydrophobization of surfaces of various substrates such as Si, $SiO_2$ and SiN by treatment with a surface treatment agent containing a silylation agent (trialkylsilylamine) and a carbonate-based solvent. Further, Patent Document 2 recites spraying, spin coating, dipping etc. as a technique for applying the surface treatment agent to the substrate, and discloses Examples in each of which the surface treatment agent was applied to the substrate by immersion.

Patent Document 3 discloses a method of forming a quaternary ammonium salt by reaction of an acyclic carbonate such as dialkyl carbonate or diaryl carbonate with water under heating.

Non-Patent Document 1 reports that a polymer is formed by reaction of a cyclic carbonate and an organic compound having an active hydrogen in the presence of an alkali catalyst.

PRIOR ART DOCUMENTS

Patent Documents

Patent Document 1: Japanese Patent No. 5648053
Patent Document 2: Japanese Laid-Open Patent Publication No. 2013-168583
Patent Document 3: Japanese Laid-Open Patent Publication No. S63-132862

Non-Patent Documents

Non-Patent Document 1: Industrial & Engineering Chemistry Research (U.S.), American Chemical Society, 2003, vol. 42, no. 4, p. 663-674

SUMMARY OF THE INVENTION

Problems to be Solved by the Invention

The wafer surface treatment method of Patent Document 1 is an effective method to improve the efficiency of the cleaning process of semiconductor wafers because a plurality of wafers can be surface-treated at once with the vapor of the liquid chemical.

As a result of researches made by the present inventor, however, it has been found that the composition of the liquid chemical introduced in vapor form is not always the same as the composition of the liquid chemical acting on the substrate. In the case where a mixture undergoes phase transition from a vapor phase to a liquid phase on a substrate, the composition of the mixture after the phase transition is determined depending on the vapor-liquid equilibrium of the mixture so that, while the component of low vapor pressure is relatively condensated and changed to a liquid, the vapor phase becomes rich in low vapor pressure component. Consequently, there is a tendency that the vapor of the liquid chemical introduced into the treatment equipment varies in composition as it flows in the vicinity of the substrate.

The liquid chemical used in the treatment method of Patent Document 1 solves the problem by utilizing a composition in which at least two kinds of components: a "silazane compound" which forms a water-repellent protective film by reaction with a OH group on the uneven pattern and an "acid" which promotes the reaction are contained at a specific content ratio as the essential components, other than the solvent, for forming the water-repellent protective film (hereinafter also referred to as "water-repellent protective film-forming components"). However, the composition of the liquid chemical actually acting on the wafer surface (in particular, the concentrations of the "silazane compound" and the "acid") can vary with the flow of the liquid chemical in the treatment equipment). This leads to variations in the water repellency imparting effect of the liquid chemical on the wafer surface.

From the viewpoint of reducing variations in the composition of the liquid chemical actually acting on the wafer surface (i.e. the composition of the liquid chemical changed into a liquid phase on the wafer surface), it is preferable to introduce the vapor of the liquid chemical with few kinds of water-repellent protective film-forming component. Even in the system where no catalyst (reaction promoting component) is present, it is preferable to use a water repellent agent having a water repellency imparting effect equivalent to that of the liquid chemical disclosed in Patent Document 1. Furthermore, it is preferable that the liquid chemical shows a chemical stability from the viewpoint of maintaining the cleanliness of the surface treatment atmosphere and the wafer as the surface treatment target.

It is accordingly an object of the present invention to provide a composition capable of solving the above-mentioned problems and a surface treatment method for, during a cleaning process of a Si element-containing wafer, forming a water-repellent protective film on the wafer with the use of a vapor of the composition.

Means for Solving the Problems

One aspect of the present invention is directed to a surface treatment method of a wafer having an uneven pattern at a surface thereof and containing a Si element in at least a recess portion of the uneven pattern, the surface treatment method comprising, during a cleaning process of the wafer, forming a water-repellent protective film (hereinafter also simply referred to as a "protective film") on at least the recess portion of the uneven pattern by supplying a vapor of a composition containing a water-repellent protective film-forming component and a solvent (hereinafter also simply referred to as a "composition") to the uneven pattern in a state that a liquid is retained in at least the recess portion of the uneven pattern, changing the vapor of the composition into a liquid and replacing the liquid retained in the recess portion with the liquid of the composition, wherein the water-repellent protective film-forming component consists of a compound of the following general formula [1], and wherein the solvent contains at least an acyclic carbonate in an amount of 50 to 100 mass % based on the total amount of the solvent

$$R^1_x(CH_3)_{3-x}SiN(R^2)_2 \quad [1]$$

where $R^1$ is each independently a group selected from the group consisting of a H atom, a $C_1$-$C_{10}$ hydrocarbon group and a $C_1$-$C_{10}$ hydrocarbon group in which a part or all of hydrogen atoms are substituted with a fluorine atom; x is an integer of 1 to 3; and $R^2$ is each independently a group selected from the group consisting of methyl, ethyl and acetyl, in which at least a part or all of hydrogen atoms may be substituted with a fluorine atom.

It is important that the amount of the acyclic carbonate contained in the solvent is 50 to 100 mass % based on the total amount of the solvent. When the amount of the acyclic carbonate contained is 50 mass % or more, the composition is unlikely to cause the deposition of insoluble matter in a short time under heating and shows a chemical stability. The amount of the acyclic carbonate contained is more preferably 80 to 100 mass %, still more preferably 90 to 100 mass %. It is most preferable that the amount of the acyclic carbonate contained is 100 mass %, that is, the solvent consists only of the acyclic carbonate.

In the wafer surface treatment method, the compound of the general formula [1] is preferably at least one kind selected from the group consisting of $(CH_3)_3SiN(CH_3)_2$, $C_2H_5Si(CH_3)_2N(CH_3)_2$, $(C_2H_5)_2Si(CH_3)N(CH_3)_2$, $(C_2H_5)_3SiN(CH_3)_2$, $C_3H_7Si(CH_3)_2N(CH_3)_2$, $(C_3H_7)_2Si(CH_3)N(CH_3)_2$, $(C_3H_7)_3SiN(CH_3)_2$, $C_4H_9Si(CH_3)_2N(CH_3)_2$, $(C_4H_9)_3SiN(CH_3)_2$, $C_5H_{11}Si(CH_3)_2N(CH_3)_2$, $C_6H_{13}Si(CH_3)_2N(CH_3)_2$, $C_7H_{15}Si(CH_3)_2N(CH_3)_2$, $C_8H_{17}Si(CH_3)_2N(CH_3)_2$, $C_9H_{19}Si(CH_3)_2N(CH_3)_2$, $C_{10}H_{21}Si(CH_3)_2N(CH_3)_2$, $(CH_3)_2Si(H)N(CH_3)_2$, $CH_3Si(H)_2N(CH_3)_2$, $(C_2H_5)_2Si(H)N(CH_3)_2$, $C_2H_5Si(H)_2N(CH_3)_2$, $C_2H_5Si(CH_3)(H)N(CH_3)_2$, $(C_3H_7)_2Si(H)N(CH_3)_2$, $C_3H_7Si(H)_2N(CH_3)_2$, $CF_3CH_2CH_2Si(CH_3)_2N(CH_3)_2$, $C_2F_5CH_2CH_2Si(CH_3)_2N(CH_3)_2$, $C_3F_7CH_2CH_2Si(CH_3)_2N(CH_3)_2$, $C_4F_9CH_2CH_2Si(CH_3)_2N(CH_3)_2$, $C_5F_{11}CH_2CH_2Si(CH_3)_2N(CH_3)_2$, $C_6F_{13}CH_2CH_2Si(CH_3)_2N(CH_3)_2$, $C_7F_{15}CH_2CH_2Si(CH_3)_2N(CH_3)_2$, $C_8F_{17}CH_2CH^2Si(CH_3)_2N(CH_3)_2$, $CF_3CH_2CH_2Si(CH_3)(H)N(CH_3)_2$, and compounds obtained by replacing dimethylamino (—$N(CH_3)_2$) groups of the aforementioned respective dimethylaminosilanes with a —$N(C_2H_5)_2$ group, a —$N(CH_3)C(O)CH_3$ group or a —$N(CH_3)C(O)CF_3$ group.

In the wafer surface treatment method, the compound of the general formula [1] is more preferably at least one kind selected from the group consisting of trimethylsilyldimethylamine and trimethylsilyldiethylamine.

In the wafer surface treatment method, the acyclic carbonate is preferably at least one kind selected from the group consisting of dimethyl carbonate, diethyl carbonate and ethyl methyl carbonate.

In the wafer surface treatment method, the amount of the compound of the general formula [1] contained in the composition is preferably 0.3 mass % or more based on the total amount of the composition in terms of the sufficient water repellency imparting effect. In terms of the cost, the amount of the compound of the general formula [1] contained in the composition is preferably 30 mass % or less based on the total amount of the composition. The amount of the compound of the general formula [1] contained is more preferably 0.5 to 15 mass %, still more preferably 1 to 10 mass %.

It is preferable in the wafer surface treatment method that the solvent of the composition contains a cyclic carbonate in an amount of 10 mass % or less.

It is preferable in the wafer surface treatment method that the composition consists of the compound of the general formula [I] and the acyclic carbonate.

In the wafer surface treatment method, the liquid retained in the recess portion is preferably a nonaqueous solvent.

It is preferable in the wafer surface treatment method to, after the formation of the water-repellent protective film on at least the recess portion, remove the composition retained in the recess portion by drying. By the drying, the solvent contained in the composition and the redundant compound of the general formula [1] left without being used for the formation of the water-repellent protective film etc. are removed. Then, the water-repellent protective film remains on the recess portion.

It is also preferable in the wafer surface treatment method to, after the formation of the water-repellent protective film on at least the recess portion, replace the liquid of the composition retained in the recess portion with a cleaning liquid different from the liquid of the composition and removing the cleaning liquid by drying.

In the wafer surface treatment method, the water-repellent protective film may be removed by performing at least one selected from the group consisting of heating treatment, light irradiation treatment, ozone exposure treatment, plasma irradiation treatment and corona discharge treatment on the surface of the wafer after the drying.

Another aspect of the present invention is directed to a composition used, in a cleaning process of a wafer having an uneven pattern at a surface thereof and containing a Si element in at least a recess portion of the uneven pattern, by being supplied as a vapor to the uneven pattern in a state that a liquid is retained in at least the recess portion of the uneven pattern, the composition containing a water-repellent protective film-forming component and a solvent, wherein the water-repellent protective film-forming component consists of a compound of the following general formula [1], and wherein the solvent contains at least an acyclic carbonate in an amount of 50 to 100 mass % based on the total amount of the solvent

$$R^1_x(CH_3)_{3-x}SiN(R^2)_2 \qquad [1]$$

where $R^1$ is each independently a group selected from the group consisting of a H atom, a $C_1$-$C_{10}$ hydrocarbon group and a $C_1$-$C_{10}$ hydrocarbon group in which a part or all of hydrogen atoms are substituted with a fluorine atom; x is an integer of 1 to 3; and $R^2$ is each independently a group selected from the group consisting of methyl, ethyl and acetyl, in which at least a part or all of hydrogen atoms may be substituted with a fluorine atom.

Effects of the Invention

According to the present invention, there is provided a novel composition for vapor treatment, which exerts a water repellency imparting effect equivalent to that in the case of surface-treating a Si element-containing wafer with the vapor of the conventional composition (in which many kinds of water-repellent protective film-forming components are used), shows a good chemical stability and uses fewer kinds of water-repellent protective film-forming component. There is also provided according to the present invention a method of surface-treating a Si element-containing wafer by forming a water-repellent protective film with the use of a vapor of the composition.

Figure 1:
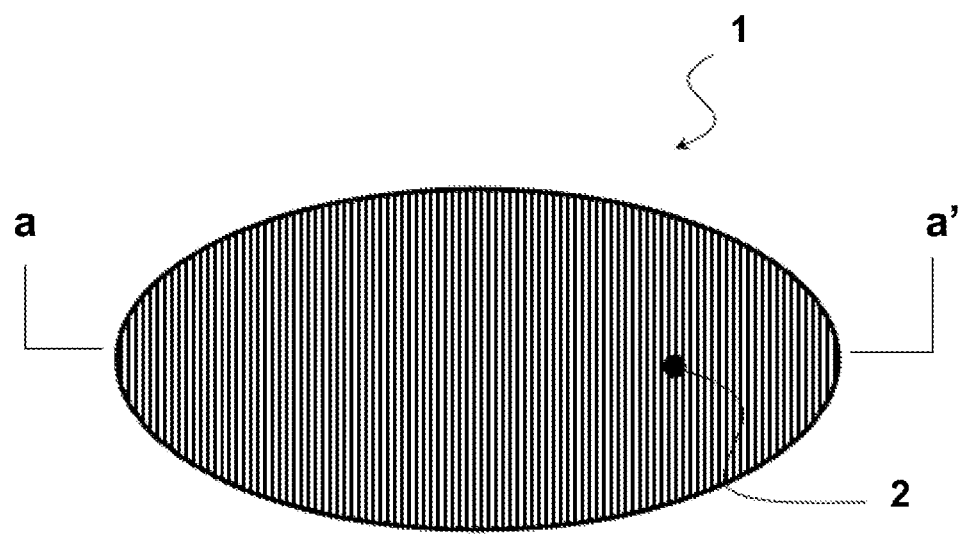
FIG. 1 is a schematic perspective view of a wafer 1 having on a surface thereof a fine uneven pattern 2.

DETAILED DESCRIPTION OF THE EMBODIMENTS (1) Composition According to Present Invention The composition according to the present invention is used, in a cleaning process of a wafer having at a surface thereof an uneven pattern and containing a Si element in at least a recess portion of the uneven pattern, by being supplied as a vapor to the uneven pattern in a state that a liquid is retained in at least the recess portion of the uneven pattern, changing the vapor of the composition to a liquid and replacing the liquid retained in the recess portion with the liquid of the composition. By such replacement, the liquid of the composition is retained in the recess portion whereby a water-repellent protective film is formed from the composition on the recess portion.

The composition according to the present invention is characterized in that the number of kinds of water-repellent protective film-forming component is lessened from the viewpoint of reducing variations in the composition actually acting on the wafer surface (i.e. the composition of the chemical solution liquefied at the wafer surface). In the composition, it is preferable that the boiling point of the water-repellent protective film-forming component is as close as possible to the boiling point of the solvent. It is particularly preferable that a difference in boiling point between the compound of the general formula [1] (hereinafter also referred to as "silylation agent") and the acyclic carbonate contained in the composition is 50° C. or less in order to easily reduce the above-mentioned variations.

As a result of extensive researches, the present inventor has found out the compound of the general formula [I] as the silylation agent capable of, even when used in the system where no catalyst (reaction promoting component) is present, exerting a water repellency imparting effect equivalent to that of the liquid chemical disclosed in Patent Document 1.

In the silylation agent of the general formula [1], $R^1_x(CH_3)_{3-x}Si$ is a water-repellent functional group-containing moiety. By reaction of a nitrogen-containing group of the silylation agent with a silanol group on the surface of the wafer, the water-repellent functional group-containing moiety of the silylation agent is fixed to the surface of the wafer. As a consequence, the water-repellent protective film is formed on the surface of the wafer.

Specific examples of the silylation agent include: dimethylaminosilanes such as $(CH_3)_3SiN(CH_3)_2$, $C_2H_5Si(CH_3)_2N(CH_3)_2$, $(C_2H_5)_2Si(CH_3)N(CH_3)_2$, $(C_2H)_3SiN(CH_3)_2$, $C_3H_7Si(CH_3)_2N(CH_3)_2$, $(C_3H_7)_2Si(CH_3)N(CH_3)_2$, $(C_3H_7)_3SiN(CH_3)_2$, $C_4H_9Si(CH_3)_2N(CH_3)_2$, $(C_4H_9)_3SiN(CH_3)_2$, $C_5H_{11}Si(CH_3)_2N(CH_3)_2$, $C_6H_{13}Si(CH_3)_2N(CH_3)_2$, $C_7H_{15}Si(CH_3)_2N(CH_3)_2$, $C_8H_{17}Si(CH_3)_2N(CH_3)_2$, $C_9H_{19}Si(CH_3)_2N(CH_3)_2$, $C_{10}H_{21}Si(CH_3)_2N(CH_3)_2$, $(CH_3)_2Si(H)N(CH_3)_2$, $CH_3Si(H)_2N(CH_3)_2$, $(C_2H_5)_2Si(H)N(CH_3)_2$, $C_2H_5Si(H)_2N(CH_3)_2$, $C_2H_5Si(CH_3)(H)N(CH_3)_2$, $(C_3H_7)_2Si(H)N(CH_3)_2$, $C_3H_7Si(H)_2N(CH_3)_2$, $CF_3CH_2CH_2Si(CH_3)_2N(CH_3)_2$, $C_2F_5CH_2CH_2Si(CH_3)_2N(CH_3)_2$, $C_3F_7CH_2CH_2Si(CH_3)_2N(CH_3)_2$, $C_4F_9CH_2CH_2Si(CH_3)_2N(CH_3)_2$, $C_5F_{11}CH_2CH_2Si(CH_3)_2N(CH_3)_2$, $C_6F_{13}CH_2CH_2Si(CH_3)_2N(CH_3)_2$, $C_7F_{15}CH_2CH_2Si(CH_3)_2N(CH_3)_2$, $C_8F_{17}CH_2CH_2Si(CH_3)_2N(CH_3)_2$ and $CF_3CH_2CH_2Si(CH_3)(H)N(CH_3)_2$; and compounds obtained by replacing dimethylamino (—N(CH_3)_2) groups of the aforementioned respective dimethylaminosilanes with a —N(C_2H_5)_2 group, a —N(CH_3)C(O)CH_3 group or a —N(CH_3)C(O)CF_3 group etc.

Among others, at least one kind selected from the group consisting of trimethylsilyldimethylamine and trimethylsilyldiethylamine is preferred because of its better water-repellency imparting effect.

The acyclic carbonate is a solvent component for dissolving the silylation agent of the general formula [1]. When the silylation agent having the above specific structure is used in combination with a predetermined amount of the acyclic carbonate, the silylation agent is unlikely to be decomposed in the composition before vaporization (that is, the composition is high in chemical stability); and the surface treatment is stably performed in the entire treatment equipment.

It is known that a carbonate reacts with an organic base under heating as described in Patent Document 3 and Non-Patent Document 1. It was hence expected that, in the case of using the carbonate as the solvent in the composition according to the present invention, the silylation agent would be consumed during heating. The composition according to the present invention was therefore expected to be not suitable for vaporization. Contrary to such expectations, it has been surprisingly found that there is seen no remarkable consumption of the silylation agent under heating whereby the water repellency imparting effect of the composition according to the present invention is not adversely affected. The detailed reason for this is not clear, but is assumed to be that the reaction of the silylation agent of the general formula [1] is inhibited due to the steric hindrance of a bulky alkylsilyl group bonded to a nitrogen atom of the silylation agent.

On the other hand, it has been found that, when a cyclic carbonate is used in the solvent component of the composition according to the present invention, there tends to occur a phenomenon in which a high boiling compound derived from the cyclic carbonate is formed by contact with the silylation agent of the general formula [1] and is increased during storage. This phenomenon is assumed to due to polymerization of the cyclic carbonate as described in Non-Patent Document 1. Thus, it is not preferable to use a large amount of cyclic carbonate as the solvent of the composition in terms of the chemical stability of the composition. Further, the presence of the polymerization product is not preferable because the polymerization product may remain in the vaporizer or may be deposited or precipitated as insoluble matter in the chemical composition when the chemical composition changes from the vapor to the liquid on the wafer surface.

In the composition according to the present invention, the solvent may contain any organic solvent other than the acyclic carbonate. Examples of the other organic solvent include: ketones such as acetone, 2-butanone, 4-methyl-2-pentanone and cyclohexanone; carboxylates such as methyl acetate, ethyl acetate, butyl acetate and propylene glycol monomethyl ether acetate; cyclic carbonates such as ethylene carbonate and propylene carbonate; and the like. In the case of using a cyclic carbonate as the other solvent component, it is preferable that the amount of the cyclic carbonate contained in the solvent of the composition is 10 mass % or less in terms of the chemical stability of the composition and the cleanliness of the surface treatment equipment and the wafer as the surface treatment target. From the above-mentioned viewpoint, it is more preferable that the cyclic carbonate is not substantially contained in the composition.

In terms of the chemical stability of the composition and the cleanliness of the surface treatment equipment and the wafer as the surface treatment target, it is particularly preferable that the composition consists of the silylation agent and the acyclic carbonate.

Specific examples of the acyclic carbonate include dimethyl carbonate, diethyl carbonate, ethyl methyl carbonate, di-n-propyl carbonate, diisopropyl carbonate, di-n-butyl carbonate, di-n-hexyl carbonate, di(3-methoxypropyl)carbonate and the like. In terms of the miscibility with the silylation agent, the acyclic carbonate is preferably at least one kind selected from the group consisting of dimethyl carbonate, diethyl carbonate and ethyl methyl carbonate.

Further, it is preferable that the total amount of water contained in the starting raw materials of the composition is 2000 mass ppm or less based on the total amount of the raw materials. When the total amount of water in the raw materials exceeds 2000 mass ppm, the effects of the silylation agent may be lowered so that it becomes difficult to form the protective film in a short time. For this reason, it is preferable that the total amount of water in the raw materials of the composition is as small as possible. The total amount of water in the raw materials of the composition is more preferably 500 mass ppm or less, still more preferably 200 mass ppm or less. Due to the fact that the larger the amount of water present, the more likely the storage stability of the composition is to be deteriorated, it is preferable that the total amount of water is small. The total amount of water in the raw materials of the composition is particularly preferably 100 mass ppm or less, more particularly preferably 50 mass ppm or less. Although it is preferable that the total amount of water in the raw materials of the composition is as small as possible, the total amount of water in the raw materials of the composition may be 0.1 mass ppm or more as long as within the above range. Consequently, it is preferable that both of the silylation agent and the solvent contained in the composition are low in water content.

It is also preferable that, in a particle measurement made in a liquid phase of the composition by a light scattering type in-liquid particle detector, the number of particles of diameter larger than 0.2 μm is 100 or less per 1 mL of the composition. When the number of particles of diameter larger than 0.2 μm exceeds 100 per 1 mL of the composition, there unfavorably occurs a risk of damage to the pattern by the particles. This can lead to a deterioration in device yield and reliability. Further, there may occur a continuation of deterioration in device yield and reliability due to contamination of the treatment equipment by the particles. When the number of particles of diameter larger than 0.2 μm is 100 or less per 1 mL of the composition, it is favorably possible to omit or reduce the cleaning of the wafer surface with a solvent or water after the formation of the protective film. Although it is preferable that the number of particles of diameter larger than 0.2 μm in the composition is as less as possible, the number of particles of diameter larger than 0.2 μm may be 1 or more per 1 mL of the composition as long as within the above range. In the present invention, the particle measurement in the liquid phase of the composition can be made by a commercially available measurement device on the basis of a laser light scattering type in-liquid particle measuring method using a laser as a light source. The particle diameter means a light scattering equivalent diameter with reference to a PSL (polystyrene latex) standard particle.

Herein, the term "particles" include not only particles such as dust, dirt, organic solid matter and inorganic solid matter contained as impurities in the raw materials, but also particles such as dust, dirt, organic solid matter and inorganic solid matter introduced as contaminants during preparation of the composition, and refer to particles finally present without being dissolved in the composition.

Furthermore, it is preferable that the amount of respective Na, Mg, K, Ca, Mn, Fe, Cu, Li, Al, Cr, Ni, Zn and Ag elements (as metal impurity elements) contained in the composition is 0.1 mass ppb or less based on the total amount of the composition. When the amount of the metal impurity element in the composition exceeds 0.1 mass ppb based on the total amount of the composition, there unfavorably occurs a risk of increase in device junction leakage current. This can lead to a deterioration in device yield and reliability. Further, there may occur a continuation of deterioration in device yield and reliability due to contamination of the treatment equipment by the metal impurity element. When the amount of the metal impurity element in the composition is 0.1 mass ppb or less based on the total amount of the composition, it is favorably possible to omit or reduce the cleaning of the wafer surface (that is, the surface of the protective film) with a solvent or water after the formation of the protective film. For this reason, it is preferable that the amount of the metal impurity elements in the composition is as small as possible. The amount of the metal impurity element in the composition may however be 0.001 mass ppb or more as long as within the above range.

(2) Water-Repellent Protective Film

As for the composition and surface treatment method according to the present invention, the water-repellent protective film refers to a film formed on a wafer surface to decrease the wettability of the wafer surface, that is, impart water repellency to the wafer surface. The term "water repellency" as used herein means decreasing a surface energy of an article surface and thereby reducing an interaction such as hydrogen bond or intermolecular force (at an interface) between water or another liquid and the article surface. The water repellency provides a great interaction reducing effect against water, and provides a certain interaction reducing effect against a mixed liquid of water and a liquid other than water or against a liquid other than water. The contact angle of a liquid to an article surface can be increased with reduction of the interaction between the liquid and the article surface. Herein, the water-repellent protective film may be formed of the silylation agent or may include a reaction product containing the silylation agent as a predominant component.

(3) Wafer

Examples of the wafer include those having formed on a surface thereof a film which contains a silicon element in the form of silicon, silicon oxide, silicon nitride etc. and those in which, when an uneven pattern is formed, at least a part of the uneven pattern contains a silicon element in the form of silicon, silicon oxide, silicon nitride etc. It is herein noted that the area of the wafer where the protective film can be formed from the composition is a surface of the silicon element-containing part of the uneven pattern.

In general, a wafer having a fine uneven pattern at a surface thereof is obtained by the following procedure. First, a resist is applied to a smooth surface of the wafer. Next, the applied resist is exposed to light through a resist mask. Exposed portions or unexposed portions of the resist are removed by etching, thereby forming a resist film with a desired uneven pattern. The resist film with the uneven pattern may alternatively be formed by pressing a mold with a pattern against the resist. Then, the wafer is subjected to etching. In this etching step, portions of the wafer surface corresponding to the recess portions of the resist pattern is selectively etched. Finally, the resist is removed. As a result, there is obtained the wafer with the fine uneven pattern.

Figure 2:
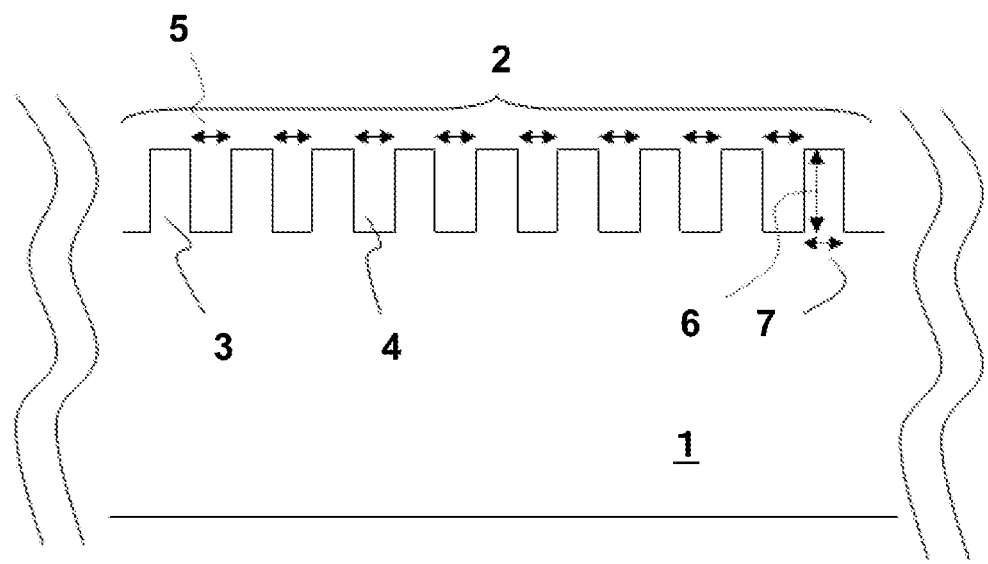
FIG. 2 is a view showing a part of a-a' cross section of FIG. 1.

After the formation of the fine uneven pattern on the wafer surface, the wafer surface is cleaned with a water-based cleaning liquid; and the water-based cleaning liquid is removed from the wafer surface by drying etc. During this cleaning process, a collapse of the pattern is likely to occur when the width of recess portions of the pattern is small and the aspect ratio of projection portions of the pattern is high. The dimensions of the uneven pattern are defined as shown in FIGS. 1 and 2. FIG. 1 is a schematic perspective view of a wafer 1 having at a surface thereof a fine uneven pattern 2. FIG. 2 is a view showing a part of a-a' cross section of FIG. 1. As shown in FIG. 2, a width 5 of the recess portions is determined as an interval between adjacent ones of the projection portions 3; and an aspect ratio of the projection portions 3 is determined by dividing a height 6 of the projection portions by a width 7 of the projection portions. The pattern collapse tends to occur during the cleaning process when the width of the recess portions is 70 nm or smaller, particularly 45 nm or smaller and when the aspect ratio of the projection portions is 4 or higher, particularly 6 or higher.

The treatment target to which the composition and surface treatment method according to the present invention is applicable is not limited to the wafer of the above structure. The composition and surface treatment method according to the present invention is also applicable to e.g. a three-dimensionally structured semiconductor wafer.

(4) Wafer Surface Treatment Method

The wafer, on which the fine uneven pattern has been formed by etching as mentioned above, may be cleaned with a water-based cleaning liquid so as to remove etching residues in advance of the wafer surface treatment method according to the present invention. The wafer may be further cleaned by replacing the water-based cleaning liquid remaining in the recess portions after the above cleaning step with a cleaning liquid different from the water-based cleaning liquid (hereinafter referred to as "cleaning liquid A").

As the water-based cleaning liquid, there can be used water or an aqueous solution containing at least one kind selected from an organic solvent, hydrogen peroxide, ozone, an acid, an alkali and a surfactant in water (e.g. with a water content of 10 mass % or more).

As the cleaning liquid A, there can be used an organic solvent, a mixture of an organic solvent and a water-based cleaning liquid, or a cleaning liquid containing at least one kind selected from an acid, an alkali and a surfactant in the organic solvent or in the mixture of the organic solvent and the water-based cleaning liquid.

As the technique of retaining the water-based cleaning liquid or the cleaning liquid A in at least the recess portions of the uneven pattern of the wafer, it is feasible to adopt a single wafer process using a spin cleaning machine in which wafers are cleaned one by one by rotating the wafer in a nearly horizontal position while supplying the liquid to the vicinity of the rotation center, or a batch process in which a plurality of wafers are cleaned by immersing the wafers in the liquid within a chamber.

Examples of the organic solvent preferably usable as the cleaning liquid A include hydrocarbons, esters, ethers, ketones, halogen-containing solvents, sulfoxide-based solvents, lactone-based solvents, carbonate-based solvents, alcohols, polyol derivatives, nitrogen-containing solvents and the like.

In a state that the liquid such as water-based cleaning liquid or cleaning liquid A is retained in at least the recess portions of the uneven pattern, the vapor of the composition according to the present invention is supplied to the uneven pattern. Then, the vapor of the composition is changed into a liquid on the wafer surface. By replacing the liquid retained in the recess portions with the liquid of the composition and retaining the liquid of the composition in the recess portions, the water-repellent protective film is formed on at least the recess portions.

In the surface treatment method according to the present invention, for example, it is feasible top lace the wafer in a chamber with the liquid retained in at least the recess portions of the uneven pattern, vaporize the composition and then supply the resulting vapor of the composition to the uneven pattern through a pipe or nozzle. During the supply of the vapor, a carrier gas such as nitrogen gas or dry air may be used.

The liquid of the composition replaced and retained in the recess portions may be further replaced with a cleaning liquid different from the composition (hereinafter referred to as "cleaning liquid B").

After the cleaning of the wafer with the water-based cleaning liquid or cleaning liquid A, the cleaning liquid is replaced with the liquid of the composition by supplying the vapor of the composition and changing the vapor of the composition into a liquid state. While the liquid of the composition is retained in at least the recess portions of the uneven pattern, the protective film is formed on at least the surface of the recess portions of the uneven pattern. In the present invention, the protective film is not necessarily continuously formed and is not necessarily uniformly formed. It is however preferable that the protective film is continuously and uniformly formed to impart higher water repellency.

Figure 3:
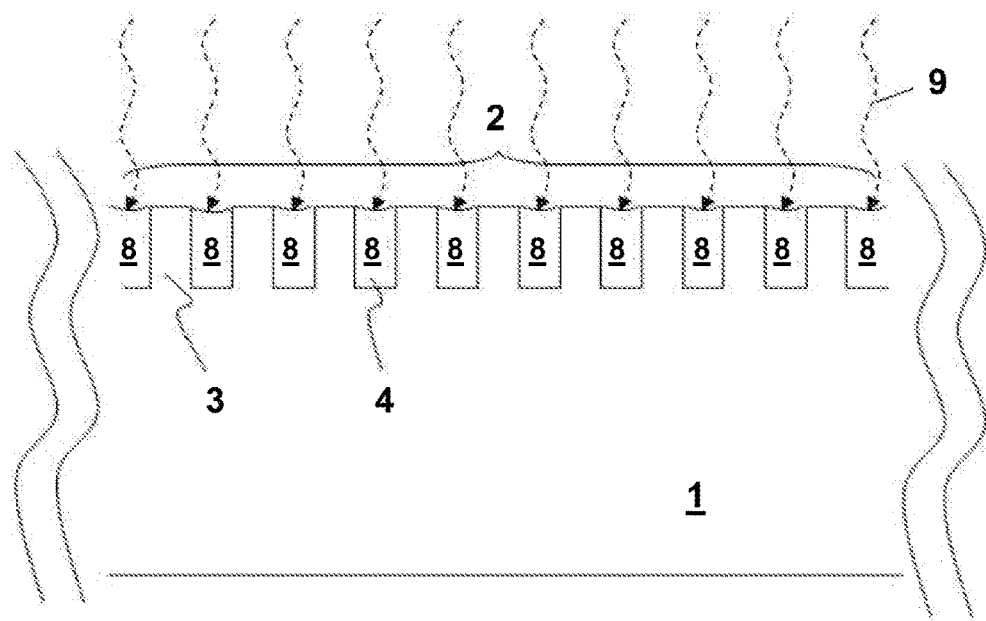
FIG. 3 is a schematic view showing a state where a vapor of a composition is supplied to recess portions of the uneven pattern in which a liquid has been retained.

FIG. 3 is a schematic view showing a state where the vapor 9 of the composition is supplied to the recess portions in which the liquid 8 such as cleaning liquid has been retained. The schematic view of FIG. 3 corresponds to apart of the a-a' cross section of FIG. 1. When the supplied vapor changes to a liquid state in the recess portions, the liquid 8 originally retained in the recess portions is replaced with the liquid of the composition. The liquid of the composition is then retained in the recess portions. In this state, the silylation agent in the retained composition reacts with the silanol group on the wafer surface so that the above-mentioned water-repellent functional group-containing moiety of the silylation agent is fixed to the wafer surface. As a consequence, the water-repellent protective film is formed on the recess portions.

There is no particular limitation on the technique of vaporizing the composition according to the present invention. As the vaporization technique, it is feasible to adopt a batch-type vaporization process which, for example, includes: introducing a predetermined amount of the composition in liquid form to a vaporization chamber, heating the introduced composition sufficiently to vaporize the whole amount of the introduced composition; and feeding the resulting vapor into a pipe or nozzle for supply to the uneven pattern. It is alternatively feasible to adopt a continuous vaporization process which, for example, includes: dropping liquid droplets of the composition into a previously heated small-scale vaporization section (e.g. pipe partially equipped with heating means); every time the composition is dropped, vaporizing the whole amount of the dropped composition, and feeding the resulting vapor into a pipe or nozzle for supply to the uneven pattern.

It is preferable to limit the temperature of vaporization of the composition to a temperature degree at which there is no fear of thermal decomposition of the silylation agent as the protective film-forming component.

One preferable condition of execution of the vapor treatment is to introduce a nitrogen gas and, after the mixed gas of the above-obtained vapor and the nitrogen gas reaches a constant composition, supply the mixed gas to the uneven pattern. The ambient temperature in the vicinity of the surface during the treatment (that is, the temperature of the vapor) is preferably lower than the boiling point of the liquid originally retained in the recess portions. When the ambient temperature (that is, the temperature of the vapor) is higher than or equal to such a boiling point, there may occur a collapse of the uneven pattern due to volatilization of the liquid originally retained in the recess portions before sufficiently replacing the liquid originally retained in the recess portions with the liquid of the composition during the vapor treatment.

After the formation of the protective film, the protective film may be subjected to drying subsequent to the replacement of the liquid composition in at least the recess portions of the uneven pattern with the cleaning liquid B.

As the cleaning liquid B, there can be used a water-based cleaning liquid, an organic solvent, a mixture of a water-based cleaning liquid and an organic solvent with or without at least one kind selected from an acid, an alkali and a surfactant, or a mixture thereof with the composition. In terms of the removal of particles and metal impurities, the cleaning liquid B is preferably water, an organic solvent or a mixture of an organic solvent and water.

The cleaning liquid B can be supplied in liquid form or in vapor form.

Examples of the organic solvent preferably usable as the cleaning liquid B include hydrocarbons, esters, ethers, ketones, halogen-containing solvents, sulfoxide-based solvents, lactone-based solvents, carbonate-based solvents, alcohols, polyol derivatives, nitrogen-containing solvents and the like.

Among others, isopropyl alcohol is preferred because isopropyl alcohol is provided with a low particle content and low metal impurity content at a low cost There are cases where, when the organic solvent is used as the cleaning liquid B, the water repellency of the protective film is less likely to be deteriorated by cleaning with the cleaning liquid B.

Figure 4:
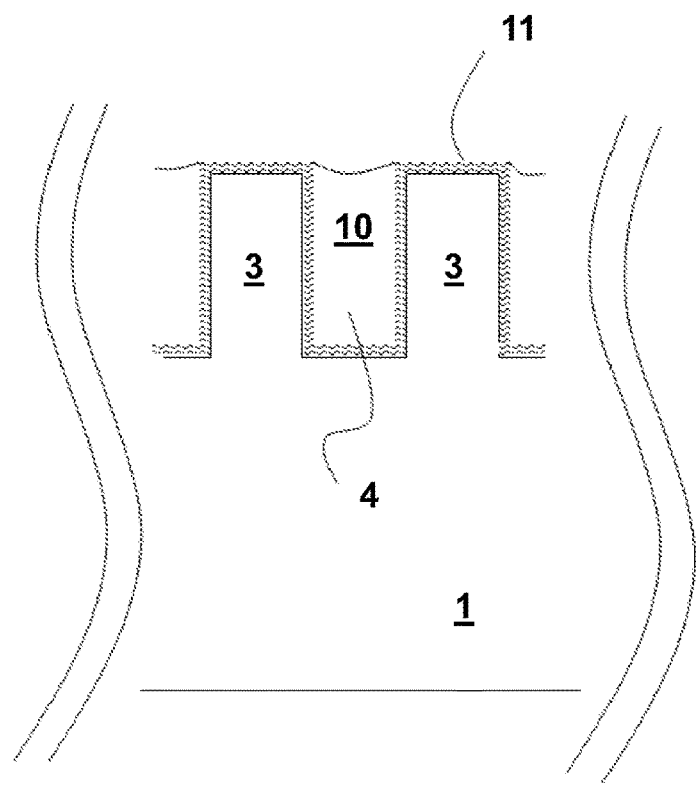
FIG. 4 is a schematic view showing a state where a liquid is retained in recess portions 4 of the uneven pattern on which a protective film has been formed.

FIG. 4 is a schematic view showing a state where a liquid is retained in the recess portions 4 to which water repellency has been imparted by the composition according to the present invention. The schematic view of FIG. 4 corresponds to a part of a-a' cross section of FIG. 1. The surface of the uneven pattern is made water repellent as the protective film 11 has been formed from the composition on the surface of the uneven pattern. Even when the liquid 10 is removed from the uneven pattern, the protective film 11 is maintained on the wafer surface.

It is herein assumed that, in a state where the protective film 11 has been formed from the composition according to the present invention on at least the recess portions of the uneven pattern of the wafer, water is retained on the surface of the recess portions. In this state, the contact angle of the water to the surface is preferably 70 to 130° so that a collapse of the pattern is made less likely to occur. The larger the contact angle, the higher the water repellency. Thus, the contact angle is more preferably 75 to 130°, still more preferably 80 to 130°. In addition, it is preferable that a decrease of the contact angle before and after the cleaning with the cleaning liquid B (i.e. the contact angle before the cleaning with the cleaning liquid B–the contact angle after the cleaning with the cleaning liquid B) is 10° or less.

The liquid retained in the recess portions 4 on which the protective film 11 has been formed from the composition is removed from the uneven pattern by drying. The liquid retained in the recess portions may be the liquid of the composition, the cleaning liquid B or a mixed liquid thereof.

The mixed liquid is a mixture in which the component (silylation agent) of the composition is contained at a lower concentration than in the composition. Accordingly, the mixed liquid may be a liquid formed in the middle of replacing the liquid composition with the cleaning liquid B or may be a liquid prepared in advance by mixing the component of the composition into the cleaning liquid B. In terms of the cleanliness of the wafer, water, the organic solvent or a mixture thereof is preferred. After the liquid is once removed from the surface of the uneven pattern, the cleaning liquid B may be retained on the surface of the uneven pattern and then removed by drying.

In the case of cleaning the wafer with the cleaning liquid B after the formation of the protective film, the cleaning time, that is, the time of retaining the cleaning liquid B is preferably 10 seconds or longer, more preferably 20 seconds or longer, in terms of the removal of the particles or impurities from the surface of the uneven pattern. From the viewpoint of the water repellency maintaining effect of the protective film on the uneven pattern, there is a tendency that, when the organic solvent is used as the cleaning liquid B, the water repellency of the wafer surface can be easily maintained even after the cleaning. On the other hand, the productivity of the wafer is deteriorated when the cleaning time is too long. The cleaning time is thus preferably 15 minutes or shorter.

By the drying, the liquid retained in the uneven pattern is removed. It is preferable to perform the drying by a known drying process such as spin drying, IPA (2-propanol) steam drying, Marangoni drying, heat drying, hot-air drying, air-blow drying or vacuum drying.

The protective film 11 may be removed after the drying. For removal of the water-repellent protective film, it is effective to cleave C—C bond and C—F bond in the water-repellent protective film. There is no particular limitation on the bond cleavage technique as long as it is capable of cleaving the above-mentioned bond. For example, it is feasible to treat the wafer surface by light irradiation, heating, ozone exposure, plasma irradiation, corona discharge or the like.

In the case of removing the protective film 11 by light irradiation, it is preferable to irradiate the protective film with ultraviolet light of wavelengths shorter than 355 nm, 340 nm and 240 nm, which respectively correspond to 336 kJ/mol, 347 kJ/mol and 485 kJ/mol, i.e., the bond energies of C—Si bond, C—C bond and C—F bond in the protective film 11. As a light source, there can be used a metal halide lamp, a low-pressure mercury lamp, a high-pressure mercury lamp, an excimer lamp, a carbon arc lamp or the like. In the case of using a metal halide lamp, the irradiation intensity of the ultraviolet light is preferably 100 mW/cm$^2$ or higher, more preferably 200 mW/cm$^2$ or higher, as measured by an illuminometer (such as an irradiation intensity meter UM-10 manufactured by Konica Minolta Sensing, Inc. with a light receptor UM-360 (peak sensitivity wavelength: 365 nm, measurement wavelength range: 310 to 400 nm)). When the irradiation intensity is lower than 100 mW/cm$^2$, it takes a long time to remove the protective film 11. It is preferable to use the low-pressure mercury lamp because the low-pressure mercury lamp emits ultraviolet light of shorter wavelengths so as to, even if the irradiation intensity is low, remove the protective film 11 in a short time.

In the case of removing the protective film 11 by light irradiation, it is preferable to generate ozone in parallel with decomposing the constituent components of the protective film 11 by irradiation with ultraviolet light and then induce oxidation volatilization of the constituent components of the protective film 11 by the ozone for shortening of the treatment time. In this case, there can be used a low-pressure mercury lamp, an excimer lamp etc. as a light source. The wafer may be heated while being subjected to light irradiation.

In the case of heating the wafer, the heating temperature of the wafer is preferably 400 to 1000° C., more preferably 500 to 900° C.; and the heating time of the wafer is preferably 10 seconds to 60 minutes, more preferably 30 seconds to 10 minutes. The heating may be done in combination with ozone exposure, plasma irradiation, corona discharge or the like. The wafer may be subjected to light irradiation while heating.

As the technique of removing the protective film 11 by heating, it is feasible to bring the wafer into contact with a heat source or to place the wafer in a heated atmosphere such as heat treatment furnace. The placement of the wafer in the heated atmosphere is industrially advantageous in terms of easy treatment operation, short treatment time and high treatment capability because, even in the case of treating a plurality of wafers, the energy for removal of the protective film 11 can be applied uniformly to the respective wafer surfaces by the placement of the wafers in the heated atmosphere.

In the case of exposing the wafer to ozone, it is preferable to supply the wafer surface with ozone generated by ultraviolet radiation from a low-pressure mercury lamp etc., low-temperature discharge under high voltage application, or the like. The wafer may be subjected to light irradiation or heating while being exposed to ozone.

The protective film on the wafer surface can be efficiently removed by any combination of the light irradiation treatment, the heating treatment, the ozone exposure treatment, the plasma irradiation treatment and the corona discharge treatment.

EXAMPLES

The present invention will be described in more detail below by way of the following experimental examples. It should however be understood that the present invention is not limited to these experimental examples.

A method of forming an uneven pattern on a surface of a wafer and a method of replacing a cleaning liquid retained in at least recess portions of the uneven pattern with another cleaning liquid have been variously studied as in other literatures and have already been established. Accordingly, evaluations were made about the chemical stability of the composition and the water repellency imparting effect exerted by the surface treatment of the wafer with the vapor of the composition in the present invention. In the following examples, water, known as a typical water-based cleaning liquid, was used as a liquid brought into contact with the surface of the wafer for contact angle evaluations.

In the case of a wafer having a fine uneven pattern at a surface thereof, however, it is not possible to exactly evaluate the contact angle of water to a protective film 11 itself formed on the uneven pattern.

The contact angle of a water drop is generally evaluated by dropping several microliters of water on a surface of a sample (substrate) and measuring an angle between the water drop and the substrate surface according to JIS R 3257 "Testing Method of Wettability of Glass Substrate Surface". In the case of the wafer having the pattern, the contact angle is enormously large. This is due to the Wenzel's effect or Cassie's effect by which the apparent contact angle of the water drop becomes increased under the influence of the substrate surface shape (roughness) on the contact angle.

In view of the above facts, the embodiment examples were each carried out by providing a wafer with a smooth surface, supplying a composition in vapor form to the smooth surface of the wafer to form a protective film on the wafer surface, and then, making various evaluations on the assumption of the thus-formed protective film as a protective film formed on an uneven pattern of a wafer. In each of the embodiment examples, a silicon wafer having a smooth surface coated with a $SiO_2$ layer, called a "$SiO_2$-coated wafer", was used as the wafer with the smooth surface.

Hereinafter, detailed explanations will be given of methods of evaluations, a method of preparing a composition, a method of surface-treating a wafer with a vapor of the composition, and results of evaluations.

[Methods of Evaluations]

(A) Evaluation of Chemical Stability of Composition

After the mixing of raw materials of the composition, the composition was left standing still at 45° C. Then, the appearance of the composition was visually observed. The chemical stability was evaluated as: "⊚" when there were seen no insoluble matter deposition and no precipitate formation even after the lapse of one week; "○" when insoluble matter deposition or precipitate formation was not seen after the standing still for one day, but was seen after the standing still for one week; "Δ" when insoluble matter deposition or precipitate formation was not seen after the standing still for 4 hours, but was seen after the standing still for one day; and "x" (unsatisfactory) there was seen insoluble matter deposition or precipitate formation within 4 hours during the standing still at 45° C. after the mixing of the raw materials of the composition.

(B) Evaluation of Contact Angle to Protective Film on Wafer Surface (Evaluation of Water Repellency Imparting Effect)

About 2 µl of pure water was dropped on a surface of a wafer on which a protective film was formed. In this state, the angle between the water drop and the wafer surface (as a contact angle) was measured with a contact angle meter (manufactured by Kyowa Interface Science Co., Ltd.: CA-X Model). The contact angle was judged as being at a satisfactory level when it was 70° or larger.

Example 1

(1) Preparation of Composition

A composition was prepared by mixing 5 g of trimethylsilyldimethylamine (($CH_3$)$_3$Si—N($CH_3$)$_2$; boiling point: about 86° C.; hereinafter also referred to as "TMSDMA") as a silylation agent and 95 g of dimethyl carbonate ($CH_3$—O—CO—O$CH_3$; boiling point: about 90°), which is an acyclic carbonate, as a solvent. After the mixing, the chemical stability of the composition was evaluated by the method explained in the above section (A). The chemical stability evaluation result of the composition was "⊚" as shown in TABLE 1.

(2) Cleaning of Silicon Wafer A silicon wafer with a smooth thermal oxide film (more specifically, a silicon wafer having on a surface thereof a thermal oxide film of 1 µm thickness) was immersed in an aqueous solution of 1 mass % hydrogen fluoride at 25° C. for 10 minutes, immersed in pure water at 25° C. for 1 minute and then immersed in 2-propanol (iPA) at 25° C. for 1 minute.

(3) Surface Treatment of Silicon Wafer with Vapor

After the cleaning, the silicon wafer was horizontally placed in a vapor treatment chamber with the iPA applied to the silicon wafer. The composition prepared in solution form was vaporized by the after-mentioned method. The resulting vapor of the composition was supplied into the vapor treatment chamber. When the vapor of the composition was changed into a liquid state on the wafer surface whose temperature was 50° C. or lower, the iPA retained on the wafer surface was replaced with the liquid of the composition. After that, the silicon wafer was taken out of the vapor treatment chamber and immersed in iPA at 25° C. for 1 minute. Finally, the silicon wafer was taken out of the iPA and then subjected to air blowing to remove the iPA from the surface of the silicon wafer.

The vaporization and supply of the composition were done as follows. Into a vaporization chamber heated to 145° C., the composition prepared in solution form was dropped at a dropping rate of 0.01 g/sec while a nitrogen gas was allowed to flow at a flow rate of 2 $dm^3$/min. The whole amount of the dropped composition was immediately vaporized. The vapor of the composition was supplied into the vapor treatment chamber under the nitrogen gas flow. This treatment operation was performed for 60 seconds.

The contact angle was evaluated by the method explained in the above section (B). As shown in TABLE 1, the initial contact angle before the surface treatment (that is, the contact angle measured after the same treatment operation except the surface treatment with the vapor) was less than 10°; and the contact angle after the surface treatment was 81°. It is thus apparent that a water repellency imparting effect was obtained in this Example.

TABLE 1

| | Composition | | | | | | | | |
|---|---|---|---|---|---|---|---|---|---|
| | Raw Materials | | | | | | | Evaluation (B) | |
| | Water-Repellent Protective Film-Forming Component | | | Amount [mass %] of Acyclic Carbonate in | Amount * [mass %] of Silylation Agent Contained Relative to | Number of Water-Repellent Protective | | Contact Angle [°] Before | Contact Angle [°] After |
| | Silylation Agent or Other | | Solvent | | | | | | |
| | Silylation Agent | Catalyst | Acyclic Carbonate | Other Solvent | Total Amount of Solvent | Total Amount of Composition | Film-Forming Component | Evaluation (A) | Surface Treatment | Surface Treatment |
| Ex. 1 | TMSDMA | None | Dimethyl Carbonate | None | 100 | 5 | 1 | ⊚ | <10 | 81 |

TABLE 1-continued

| | Composition | | | | | | | | |
|---|---|---|---|---|---|---|---|---|---|
| | Raw Materials | | | | | | | | |
| | Water-Repellent Protective Film-Forming Component | | | | Amount [mass %] of Acyclic Carbonate in Total Amount of Solvent | Amount * [mass %] of Silylation Agent Contained Relative to Total Amount of Composition | Number of Water-Repellent Protective Film-Forming Component | Evaluation (B) | |
| | Silylation Agent or Other Silylation Agent | Catalyst | Solvent | | | | | Evaluation (A) | Contact Angle [°] Before Surface Treatment | Contact Angle [°] After Surface Treatment |
| | | | Acyclic Carbonate | Other Solvent | | | | | | |
| Ex. 2 | TMSDMA | None | Diethyl Carbonate | None | 100 | 5 | 1 | ◎ | <10 | 81 |
| Ex. 3 | TMSDMA | None | Dimethyl Carbonate Diethyl Carbonate | None | 100 | 5 | 1 | ◎ | <10 | 81 |
| Ex. 4 | TMSDMA | None | Diethyl Carbonate | Propylene Carbonate | 89 | 5 | 1 | ○ | <10 | 83 |
| Ex. 5 | TMSDMA | None | Diethyl Carbonate | Propylene Carbonate | 53 | 5 | 1 | Δ | <10 | 84 |
| Ex. 6 | TMSDMA | None | Dimethyl Carbonate | None | 100 | 2 | 1 | ◎ | <10 | 80 |
| Ex. 7 | TMSDMA | None | Dimethyl Carbonate | None | 100 | 8 | 1 | ◎ | <10 | 81 |
| Ex. 8 | TMSDMA | None | Dimethyl Carbonate | None | 100 | 11 | 1 | ◎ | <10 | 81 |
| Comp. Ex. 1 | HMDS | TMSTFA | None | HFE-7100 PGMEA | 0 | — | 2 | Not Evaluated | <10 | 80 |
| Comp. Ex. 2 | HMDS | TEA | None | HFE-7100 PGMEA | 0 | — | 2 | Not Evaluated | <10 | 78 |
| Como. Ex. 3 | HMDS | TFAA | None | HFE-7100 PGMEA | 0 | — | 2 | Not Evaluated | <10 | 80 |
| Comp. Ex. 4 | HMDS | TMSTFA | None | DCTFP PGMEA | 0 | — | 2 | Not Evaluated | <10 | 82 |
| Comp. Ex. 5 | TMDS | TMSTFA | None | HFE-7100 PGMEA | 0 | — | 2 | Not Evaluated | <10 | 82 |
| Comp. Ex. 6 | TMDS | TFA | None | HFE-7100 PGMEA | 0 | — | 2 | Not Evaluated | <10 | 80 |
| Comp. Ex. 7 | TMSDMA | None | Diethyl Carbonate | Propylene Carbonate | 37 | 5 | 1 | X | <10 | 82 |

* In Comparative Examples 1-6, the content amount of the silylation agent was indicated as "—" because the compound of the general formula [1] (as the silylation agent) was not contained in the composition.

Example 2

A composition was prepared in the same manner as in Example 1, except for using diethyl carbonate ($CH_3CH_2$—O—CO—O—$CH_2CH_3$; boiling point: about 126° C.), which is an acyclic carbonate, in place of the solvent used in Example 1. Then, the wafer surface treatment and evaluations were conducted in the same manner as above using the prepared composition. The results are shown in TABLE 1.

Example 3

A composition was prepared in the same manner as in Example 1, except for using the following raw materials: 5 g of TMSDMA as a silylation agent; and, as a solvent, 45 g of dimethyl carbonate and 50 g of diethyl carbonate, both of which are acyclic carbonates. The wafer surface treatment and evaluations were conducted in the same manner as above using the prepared composition. The results are shown in TABLE 1.

Example 4

A composition was prepared in the same manner as in Example 1, except for 1.5 using the following raw materials: 5 g of TMSDMA as a silylation agent; and, as a solvent, 10 g of propylene carbonate (boiling point: about 240° C.), which is a cyclic carbonate, and 85 g of diethyl carbonate, which is an acyclic carbonate. The wafer surface treatment and evaluations were conducted in the same manner as above using the prepared composition. The results are shown in TABLE 1.

Example 5

A composition was prepared in the same manner as in Example 1, except for using the following raw materials: 5 g of TMSDMA as a silylation agent; and, as a solvent, 45 g of propylene carbonate, which is a cyclic carbonate, and 50 g of diethyl carbonate, which is an acyclic carbonate. The wafer surface treatment and evaluations were conducted in the same manner as above using the prepared composition. The results are shown in TABLE 1.

Example 6

A composition was prepared in the same manner as in Example 1, except for using the following raw materials: 2 g of TMSDMA as a silylation agent; and 98 g of dimethyl carbonate as a solvent. The wafer surface treatment and evaluations were conducted in the same manner as above using the prepared composition. The results are shown in TABLE 1.

Example 7

A composition was prepared in the same manner as in Example 1, except for using the following raw materials: 8 g of TMSDMA as a silylation agent; and 92 g of dimethyl carbonate as a solvent. The wafer surface treatment and evaluations were conducted in the same manner as above using the prepared composition. The results are shown in TABLE 1.

Example 8

A composition was prepared in the same manner as in Example 1, except for using the following raw materials: 11 g of TMSDMA as a silylation agent; and 88 g of dimethyl carbonate as a solvent. The wafer surface treatment and evaluations were conducted in the same manner as above using the prepared composition. The results are shown in TABLE 1.

Comparative Example 1

A composition was prepared in the same manner as in Example 1, except for using the following raw materials: 1.5 g of 1,1,1,2,2,2-hexamethyldisilazane (boiling point: about 125° C.; hereinafter also referred to as "HMDS") as a silylation agent not falling under the general formula [1] (hereinafter also referred to as the "other silylation agent") in place of the compound of the general formula [1]; 0.1 g of trimethylsilyl trifluoroacetate (boiling point: about 90° C.; hereinafter also referred to as "TMSTFA") as a catalyst; and, as a solvent, 95.4 g of hydrofluoroether (boiling point: about 61° C.) available from 3M Japan Limited (as Novec (trademark) HFE-7100) and 3 g of propylene glycol monomethyl ether acetate (boiling point: about 146° C.; hereinafter also referred to as "PGMEA"). The wafer surface treatment and evaluations were conducted in the same manner as above using the prepared composition. The results are shown in TABLE 1.

Comparative Example 2

A composition was prepared in the same manner as in Example 1, except for using the following raw materials: 1.5 g of HMDS as the other silylation agent in place of the compound of the general formula [1]; 0.1 g of trifluoroacetic acid (boiling point: about 72° C.; hereinafter also referred to as "TFA") as a catalyst; and, as a solvent, 95.4 g of Novec (trademark) HFE-7100 and 3 g of PGMEA. The wafer surface treatment and evaluations were conducted in the same manner as above using the prepared composition. The results are shown in TABLE 1.

Comparative Example 3

A composition was prepared in the same manner as in Example 1, except for using the following raw materials: 1.5 g of HMDS as the other silylation agent in place of the compound of the general formula [1]; 0.1 g of trifluoroacetic anhydride (boiling point: about 40° C.; hereinafter also referred to as "TFAA") as a catalyst; and, as a solvent, 95.4 g of Novec (trademark) HFE-7100 and 3 g of PGMEA. The wafer surface treatment and evaluations were conducted in the same manner as above using the prepared composition. The results are shown in TABLE 1.

Comparative Example 4

A composition was prepared in the same manner as in Example 1, except for using the following raw materials: 1.5 g of HMDS as the other silylation agent in place of the compound of the general formula [1]; 0.1 g of TMSTFA as a catalyst; and, as a solvent, 95.4 g of 1,2-dichloro-3,3,3-trifluoro-1-propene (boiling point: about 54° C.; hereinafter also referred to as "DCTFP") and 3 g of PGMEA. The wafer surface treatment and evaluations were conducted in the same manner as above using the prepared composition. The results are shown in TABLE 1.

Comparative Example 5

A composition was prepared in the same manner as in Example 1, except for using the following raw materials: 1.5 g of 1,1,2,2-tetramethyldisilazane (boiling point: about 100° C.; hereinafter also referred to as "TMDS") as the other silylation agent in place of the compound of the general formula [1]; 0.1 g of TMSTFA as a catalyst: and, as a solvent, 95.4 g of Novec (trademark) HFE-7100 and 3 g of PGMEA. The wafer surface treatment and evaluations were conducted in the same manner as above using the prepared composition. The results are shown in TABLE 1.

Comparative Example 6

A composition was prepared in the same manner as in Example 1, except for using the following raw materials: 1.5 g of TMDS as the other silylation agent in place of the compound of the general formula [1]; 0.1 g of TFA as a catalyst; and, as a solvent, 95.4 g of Novec (trademark) HFE-7100 and 3 g of PGMEA. The wafer surface treatment and evaluations were conducted in the same manner as above using the prepared composition. The results are shown in TABLE 1.

Comparative Example 7

A composition was prepared in the same manner as in Example 1, except for using the following raw materials: 5 g of TMSDMA as a silylation agent; and, as a solvent, 60 g of propylene carbonate, which is a cyclic carbonate, and 35 g of diethyl carbonate, which is an acyclic carbonate. The wafer surface treatment and evaluations were conducted in the same manner as above using the prepared composition. The results are shown in TABLE 1.

When the water repellency imparting effects of the compositions of Examples 1-8 and Comparative Examples 1-7 were evaluated in terms of the contact angle as measured by the method explained in the above section (A), all of the compositions had a contact angle of about 80° so that the water repellency imparting effects of the respective compositions were equivalent to one another.

Further, the number of water-repellent protective film-forming components was made among the respective compositions. As shown in TABLE 1, the number of water-repellent protective film-forming components in each of the compositions Examples 1-8 is 1; and the number of water-repellent protective film-forming components in each of the compositions of Comparative Examples 1-6 is 2.

In each of Examples 1-8 where the amount of acyclic carbonate contained relative to the total amount of the solvent in the composition was in the range of 50 to 100 mass %, there were seen no insoluble matter deposition and no precipitate formation within 4 hours during the standing still at 45° C. after the mixing of the raw materials of the composition. Thus, each of the compositions of Examples 1-8 showed a chemical stability. In Comparative Example 7 where the amount of acyclic carbonate contained relative to total amount of the solvent in the composition was smaller than 50 mass % (more specifically, was 37 mass %), by contrast, insoluble matter deposition was seen within 4 hours during the standing still at 45° C. after the mixing of the raw materials of the composition. The composition of Comparative Example 7 was thus insufficient in chemical stability.

It has been shown by the above results that the present invention provides the novel composition which shows a good chemical stability, exerts a water repellency imparting effect equivalent to that in the case of surface-treating the Si element-containing wafer with the vapor of the conventional composition (in which many kinds of water-repellent protective film-forming components are used), and uses fewer kinds of water-repellent protective film-forming component, and the method of surface-treating the Si element-containing wafer by forming the water-repellent protective film with the use of the vapor of the novel composition.

DESCRIPTION OF REFERENCE NUMERALS

1: Wafer
2: Fine uneven pattern on wafer surface
3: Projection portion of pattern
4: Recess portion of pattern
5: Width of recess portion
6: Height of projection portion
7: Width of projection portion
8: Liquid retained in recess portion 4
9: Vapor of composition
10: Liquid retained in recess portion 4
11: Protective film

The invention claimed is:
1. A surface treatment method of a wafer, the wafer having an uneven pattern at a surface thereof and containing a Si element in at least a recess portion of the uneven pattern, the surface treatment method comprising:
  a cleaning process of the wafer, wherein the cleaning process of the wafer comprises:
    forming a water-repellent protective film on at least the recess portion of the uneven pattern by heating a composition containing a water-repellent protective film-forming component and a solvent to generate a vapor of the composition,
    supplying the vapor of the composition to the uneven pattern in a state that a liquid is retained in at least the recess portion,
    changing the vapor of the composition into a liquid and replacing the liquid retained in the recess portion with the liquid of the composition,
  wherein, in the composition containing the water-repellent protective film-forming component and the solvent, the water-repellent protective film-forming component consists of a compound of the following general formula [1], and
  the solvent contains at least an acyclic carbonate in an amount of 50 to 100 mass % based on the total amount of the solvent,

$$R^1_x(CH_3)_{3-x}SiN(R^2)_2 \quad [1]$$

where $R^1$ is each independently a group selected from the group consisting of a H atom, a $C_1$-$C_{10}$ hydrocarbon group and a $C_1$-$C_{10}$ hydrocarbon group in which a part or all of hydrogen atoms are substituted with a fluorine atom; x is an integer of 1 to 3; and $R^2$ is each independently a group selected from the group consisting of methyl, ethyl and acetyl, in which at least a part or all of hydrogen atoms may be substituted with a fluorine atom.

2. The surface treatment method of the wafer according to claim 1, wherein the compound of the general formula [1] is at least one kind selected from the group consisting of dimethylaminosilanes represented by $(CH_3)_3SiN(CH_3)_2$, $C_2H_5Si(CH_3)_2N(CH_3)_2$, $(C_2H_5)_2Si(CH_3)N(CH_3)_2$, $(C_2H_5)_3SiN(CH_3)_2$, $C_3H_7Si(CH_3)_2N(CH_3)_2$, $(C_3H_7)_2Si(CH_3)N(CH_3)_2$, $(C_3H_7)_3SiN(CH_3)_2$, $C_4H_9Si(CH_3)_2N(CH_3)_2$, $(C_4H_9)_3SiN(CH_3)_2$, $C_5H_{17}Si(CH_3)_2N(CH_3)_2$, $C_6H_{13}Si(CH_3)_2N(CH_3)_2$, $C_7H_{15}Si(CH_3)_2N(CH_3)_2$, $C_8H_{17}Si(CH_3)_2N(CH_3)_2$, $C_9H_{19}Si(CH_3)_2N(CH_3)_2$, $C_{10}H_{21}Si(CH_3)_2N(CH_3)_2$, $(CH_3)_2Si(H)N(CH_3)_2$, $CH_3Si(H)_2N(CH_3)_2$, $(C_2H_5)_2Si(H)N(CH_3)_2$, $C_2H_5Si(H)_2N(CH_3)_2$, $C_2H_5Si(CH_3)(H)N(CH_3)_2$, $(C_3H_7)_2Si(H)N(CH_3)_2$, $C_3H_7Si(H)_2N(CH_3)_2$, $CF_3CH_2CH_2Si(CH_3)_2N(CH_3)_2$, $C_2F_5CH_2CH_2Si(CH_3)_2N(CH_3)_2$, $C_3F_7CH_2CH_2Si(CH_3)_2N(CH_3)_2$, $C_4F_9CH_2CH_2Si(CH_3)_2N(CH_3)_2$, $C_5F_{11}CH_2CH_2Si(CH_3)_2N(CH_3)_2$, $C_6F_{13}CH_2CH_2Si(CH_3)_2N(CH_3)_2$, $C_7F_{15}CH_2CH_2Si(CH_3)_2N(CH_3)_2$, $C_8F_{17}CH_2CH_2Si(CH_3)_2N(CH_3)_2$ and $CF_3CH_2CH_2Si(CH_3)(H)N(CH_3)_2$, and compounds obtained by replacing dimethylamino groups (—N(CH$_3$)$_2$) of the respective dimethylaminosilanes with a —N(C$_2$H$_5$)$_2$ group, a —N(CH$_3$)C(O)CH$_3$ group or a —N(CH$_3$)C(O)CF$_3$ group.

3. The surface treatment method of the wafer according to claim 1, wherein the compound of the general formula [1] is at least one kind selected from the group consisting of trimethylsilyldimethylamine and trimethylsilyldiethylamine.

4. The surface treatment method of the wafer according to claim 1, wherein the acyclic carbonate is at least one kind selected from the group consisting of dimethyl carbonate, diethyl carbonate and ethyl methyl carbonate.

5. The surface treatment method of the wafer according to claim 1, wherein the compound of the general formula [1] is contained in an amount of 0.3 to 30 mass % based on the total amount of the composition.

6. The surface treatment method of the wafer according to claim 1, wherein the solvent of the composition contains a cyclic carbonate in an amount of 10 mass % or less.

7. The surface treatment method of the wafer according to claim 1, wherein the composition consists of the compound of the general formula [1] and the acyclic carbonate.

8. The surface treatment method of the wafer according to claim 1, wherein the liquid retained in the recess portion is a nonaqueous solvent.

9. The surface treatment method of the wafer according to claim 1, wherein a difference in boiling point between the compound of the general formula [1] and the acyclic carbonate is 50° C. or less.

10. The surface treatment method of the wafer according to claim 1, wherein a temperature of the vapor is lower than a boiling point of the liquid retained in at least the recess portion.

11. The surface treatment method of the wafer according to claim 1, comprising, after forming the water-repellent protective film on at least the recess portion, removing the composition retained in the recess portion by drying.

12. The surface treatment method of the wafer according to claim 11, further comprising removing the water-repellent protective film by performing at least one selected from the group consisting of heating treatment, light irradiation treatment, ozone exposure treatment, plasma irradiation treatment and corona discharge treatment on the surface of the wafer after the drying.

13. The surface treatment method of the wafer according to claim 1, comprising, after forming the water-repellent protective film on at least the recess portion, replacing the liquid of the composition retained in the recess portion with a cleaning liquid different from the liquid of the composition and then removing the cleaning liquid by drying.

14. The surface treatment method of the wafer according to claim 13, further comprising removing the water-repellent protective film by performing at least one selected from the group consisting of heating treatment, light irradiation treatment, ozone exposure treatment, plasma irradiation treatment and corona discharge treatment on the surface of the wafer after the drying.

15. A composition used, in a cleaning process of a wafer having an uneven pattern at a surface thereof and containing a Si element in at least a recess portion of the uneven pattern, by being supplied as a vapor to the uneven pattern in a state that a liquid is retained in at least the recess portion of the uneven pattern, wherein the composition consists essentially of a water-repellent protective film-forming component and an acyclic carbonate as a solvent, and wherein the water-repellent protective film-forming component consists of a compound of the following general formula [1]

$$R^1{}_x(CH_3)_{3-x}SiN(R^2)_2 \qquad [1]$$

where $R^1$ is each independently a group selected from the group consisting of a H atom, a $C_1$-$C_{10}$ hydrocarbon group and a $C_1$-$C_{10}$ hydrocarbon group in which a part or all of hydrogen atoms are substituted with a fluorine atom; x is an integer of 1 to 3; and $R^2$ is each independently a group selected from the group consisting of methyl, ethyl and acetyl, in which at least a part or all of hydrogen atoms may be substituted with a fluorine atom.

16. The composition according to claim 15, wherein a difference in boiling point between the compound of the general formula [1] and the acyclic carbonate is 50° C. or less.

* * * * *